(12) United States Patent
Kono et al.

(10) Patent No.: US 9,029,869 B2
(45) Date of Patent: May 12, 2015

(54) SEMICONDUCTOR DEVICE

(75) Inventors: Hiroshi Kono, Kanagawa (JP); Takashi Shinohe, Kanagawa (JP); Chiharu Ota, Kanagawa (JP); Makoto Mizukami, Kanagawa (JP); Takuma Suzuki, Kanagawa (JP); Johji Nishio, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1032 days.

(21) Appl. No.: 13/034,264

(22) Filed: Feb. 24, 2011

(65) Prior Publication Data

US 2012/0056195 A1 Mar. 8, 2012

(30) Foreign Application Priority Data

Sep. 6, 2010 (JP) ................... 2010-198629

(51) Int. Cl.
*H01L 29/15* (2006.01)
*H01L 29/739* (2006.01)
*H01L 29/10* (2006.01)
*H01L 29/66* (2006.01)

(52) U.S. Cl.
CPC ........ *H01L 29/7395* (2013.01); *H01L 29/1033* (2013.01); *H01L 29/66333* (2013.01)

(58) Field of Classification Search
USPC .......................................................... 257/77
See application file for complete search history.

(56) References Cited

U.S. PATENT DOCUMENTS

| | | | | |
|---|---|---|---|---|
| 4,613,889 A | * | 9/1986 | Kuo ............................... | 257/302 |
| 5,346,835 A | * | 9/1994 | Malhi et al. .................... | 438/200 |
| 6,054,352 A | | 4/2000 | Ueno | |
| 7,719,086 B2 | | 5/2010 | Ikuta et al. | |
| 2006/0102908 A1 | * | 5/2006 | Imai et al. ...................... | 257/77 |

FOREIGN PATENT DOCUMENTS

| | | |
|---|---|---|
| JP | 59-74674 | 4/1984 |
| JP | 6-13620 | 1/1994 |
| JP | 10-233503 | 9/1998 |

(Continued)

OTHER PUBLICATIONS

Office Action issued Dec. 27, 2011, in Japanese Patent Application No. 2010-198629 (with English-language translation).

(Continued)

*Primary Examiner* — Anthony Ho
(74) *Attorney, Agent, or Firm* — Oblon, McClelland, Maier & Neustadt, L.L.P.

(57) ABSTRACT

One embodiment of a semiconductor device includes: a silicon carbide substrate including first and second principal surfaces; a first-conductive-type silicon carbide layer on the first principal surface; a second-conductive-type first silicon carbide region at a surface of the first silicon carbide layer; a first-conductive-type second silicon carbide region at the surface of the first silicon carbide region; a second-conductive-type third silicon carbide region at the surface of the first silicon carbide region; a second-conductive-type fourth silicon carbide region formed between the first silicon carbide region and the second silicon carbide region, and having an impurity concentration higher than that of the first silicon carbide region; a gate insulator; a gate electrode formed on the gate insulator; an inter-layer insulator; a first electrode connected to the second silicon carbide region and the third silicon carbide region; and a second electrode on the second principal surface.

20 Claims, 7 Drawing Sheets

(56) References Cited

FOREIGN PATENT DOCUMENTS

| | | |
|---|---|---|
| JP | 2000-77662 | 3/2000 |
| JP | 2001-127285 | 5/2001 |
| JP | 2008-147415 | 6/2008 |

OTHER PUBLICATIONS

Kenya Yamashita et al., "Normally-off 4H-SiC Power MOSFET with Submicron Gate", Materials Science Forum, vols. 600-603, 2009, pp. 1115-1118.

\* cited by examiner

SEMICONDUCTOR DEVICE

CROSS-REFERENCE TO RELATED APPLICATION

This application is based upon and claims the benefit of priority from Japanese Patent Application No. 2010-198629, filed on Sep. 6, 2010, the entire contents of which are incorporated herein by reference.

FIELD

Embodiments described herein relate generally to a semiconductor device.

BACKGROUND

Silicon carbide (hereinafter also referred to as SiC) is expected as a next-generation power semiconductor device. SiC has excellent physical properties compared with Si. That is, SiC has a bandgap three times that of Si, breakdown field strength about ten times that of Si, and thermal conductivity about three times that of Si. An extremely-low-loss power semiconductor device that can be operated at a high temperature can be implemented using the characteristics of SiC.

There are various high-voltage semiconductor devices in which the characteristics of SiC are utilized. For example, there is well known a Double Implantation MOSFET (hereinafter referred to as DIMOSFET) in which a p well and a source region are formed by ion implantation.

The DIMOSFET is easily produced because of use of a planar process in which a channel can accurately be formed by an ion implantation method. Because a gate is driven by voltage control, a power of a driving circuit can be reduced, and the DIMOSFET is suitable to a parallel operation.

However, in the device made of SiC, because channel mobility is degraded by an interface state of a MOS interface, a channel resistance (on resistance) of the MOSFET is much higher than that of the device made of Si. A method for setting a channel length to 1 µm or less has been proposed in order to solve the problem.

When the channel length is shortened, a leakage current is increased between a source and a drain at a high temperature of 250° C. or more, whereby a breakdown voltage of the device decrease. Therefore, a balance between a high-temperature operation and a low resistance (low on resistance) of the channel is hardly achieved.

DETAILED DESCRIPTION

Figure 1:
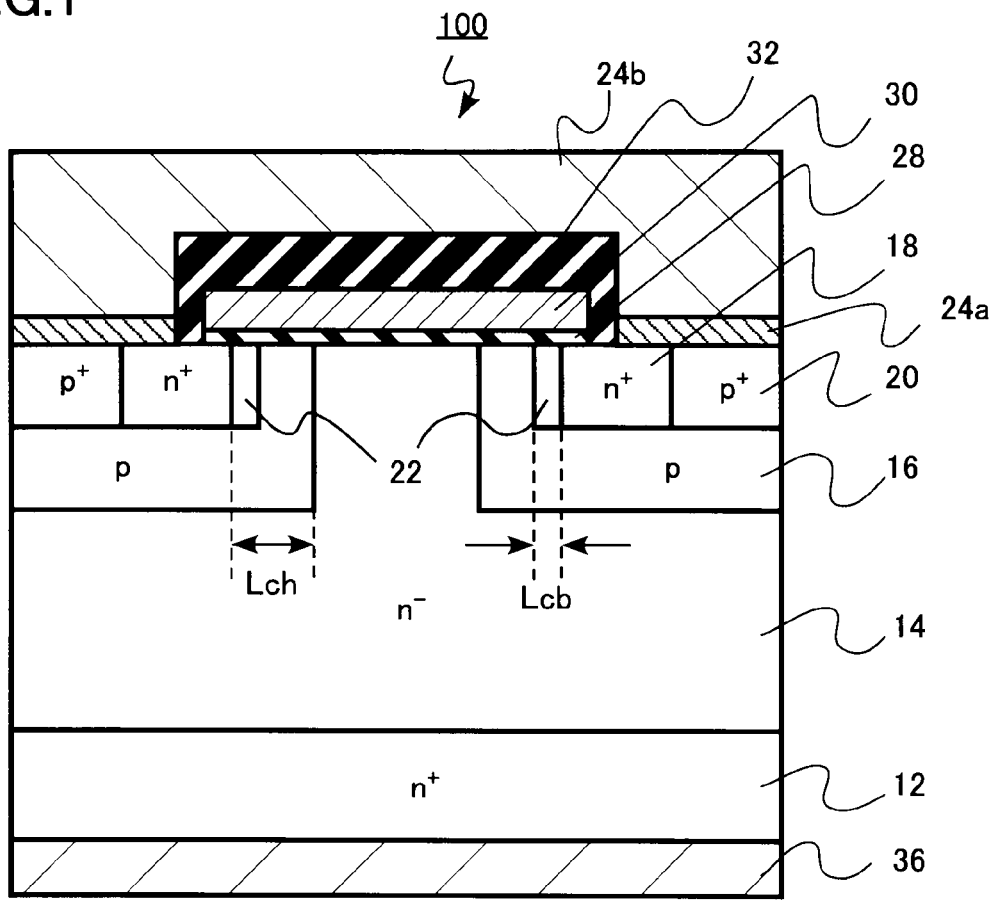
FIG. 1 is a sectional view illustrating a configuration of a MOSFET that is a semiconductor device according to a first embodiment.

A semiconductor device according to an embodiment includes: a silicon carbide substrate that includes first and second principal surfaces; a first-conductive-type silicon carbide layer that is provided on the first principal surface of the silicon carbide substrate; a second-conductive-type first silicon carbide region that is formed at or on a surface of the silicon carbide layer; a first-conductive-type second silicon carbide region that is formed at or on the surface of the first silicon carbide region; a second-conductive-type third silicon carbide region that is formed at or on the surface of the first silicon carbide region; a second-conductive-type fourth silicon carbide region that is formed between the first silicon carbide region and the second silicon carbide region, and has an impurity concentration higher than that of the first silicon carbide region; a gate insulator that is continuously formed on surfaces of the silicon carbide layer, the first silicon carbide region, and the fourth silicon carbide region; a gate electrode that is formed on the gate insulator; an inter-layer insulator with which the gate electrode is coated; a first electrode that is electrically connected to the second silicon carbide region and the third silicon carbide region; and a second electrode that is formed on the second principal surface of the silicon carbide substrate.

Embodiments of the invention will be described below with reference to the drawings.

First Embodiment

A semiconductor device according to a first embodiment includes a silicon carbide substrate that includes first and second principal surfaces and a first-conductive-type silicon carbide layer that is provided in the first principal surface of the silicon carbide substrate. The semiconductor device of the first embodiment includes a second-conductive-type first silicon carbide region that is formed at or on a surface of the silicon carbide layer. The semiconductor device of the first embodiment includes a first-conductive-type second silicon carbide region that is formed at or on the surface of the first silicon carbide region and a second-conductive-type third silicon carbide region that is formed at or on the surface of the first silicon carbide region. The semiconductor device of the first embodiment includes a second-conductive-type fourth silicon carbide region that is formed between the first silicon carbide region and the second silicon carbide region, and has an impurity concentration higher than that of the first silicon carbide region.

The semiconductor device of the first embodiment further includes: a gate insulator that is continuously formed on surfaces of the silicon carbide layer, the first silicon carbide region, and the fourth silicon carbide region; a gate electrode that is formed on the gate insulator; an inter-layer insulator with which the gate electrode is coated; a first electrode that is electrically connected to the second silicon carbide region and the third silicon carbide region; and a second electrode that is formed on the second principal surface of the silicon carbide substrate.

FIG. 1 is a sectional view illustrating a configuration of a MOSFET that is the semiconductor device of the first embodiment. A MOSFET 100 includes a SiC substrate (silicon carbide substrate) 12 including first and second principal surfaces. In FIG. 1, the first principal surface is a surface located on an upper side of FIG. 1, and the second principal surface is a surface located on a lower side of FIG. 1. The SiC substrate 12 is a hexagonal SiC substrate (n+ substrate) that contains, for example, N (nitrogen) as an n type impurity with an impurity concentration of about $5 \times 10^{18}$ to about $1 \times 10^{19}$ cm$^{-3}$.

An n type SiC layer (n− layer) 14 having an n type impurity concentration of about $5 \times 10^{15}$ to about $2 \times 10^{16}$ cm$^{-3}$ is formed on the first principal surface of the SiC substrate 12. For example, the n− layer 14 has a thickness of about 5 to about 10 µm.

A p type first SiC region (p well region) 16 having a p type impurity concentration of about $5 \times 10^{15}$ to about $1 \times 10^{17}$ cm$^{-3}$ is partially formed on a surface of the n− layer 14. For example, the p well region 16 has a depth of about 0.6 µm.

An n type second SiC region (source region) 18 having an n type impurity concentration of about $1 \times 10^{20}$ cm$^{-3}$ is partially formed on the surface of the first SiC region (p well region) 16. The depth of the source region 18 is smaller than that of the first SiC region (p well region) 16. For example, the source region 18 has the depth of about 0.3 µm.

A p type third SiC region (p well contact region) 20 having a p type impurity concentration of about $1 \times 10^{19}$ to about $1 \times 10^{20}$ cm$^{-3}$ is formed in part of the surface of the first SiC region (p well region) 16 and on a side face of the n type second SiC region (source region) 18. For example, the p well contact region 20 has the depth of about 0.3 µm.

A p type fourth SiC region 22 having an impurity concentration higher than that of the first SiC region 16 is formed between the first SiC region (p well region) 16 and the second SiC region (source region) 18 in part of the surface of the first SiC region 16. Hereinafter the fourth SiC region 22 is also referred to as a channel buffer region.

A gate insulator 28 is continuously formed on the surfaces of the first SiC layer (n− layer) 14, the first SiC region (p well region) 16, and the fourth SiC region 22 so as to cross the regions 16 and 22 and the layer 14. For example, a Si oxide film or a high-k insulator can be used as the gate insulator 28.

A gate electrode 30 is formed on the gate insulator 28. For example, the gate electrode 30 may be made of polysilicon. An inter-layer insulator 32 made of silicon oxide is formed on the gate electrode 30.

The first SiC region 16 sandwiched between the second SiC region (source region) 18 and the first SiC layer (n− layer) 14 below the gate electrode 30 constitutes a channel region.

A first electrode (source/p well common electrode) 24 is provided while electrically connected to the second SiC region (source region) 18 and the third SiC region (p well contact region) 20. For example, the first electrode (source/p well common electrode) 24 includes an Ni barrier metal layer 24a and an Al metal layer 24b formed on the barrier metal layer 24a. In the Ni barrier metal layer 24a and the Al metal layer 24b, an alloy may be made by a reaction. A second electrode (drain electrode) 36 is formed on the second principal surface of the SiC substrate 12.

In the first embodiment, for example, N (nitrogen) or P (phosphorous) is preferably used as the n type impurity. Alternatively, As (arsenic) and the like may be used. For example, Al (aluminum) is preferably used as the p type impurity. Alternatively, B (boron) and the like may be used.

In the MOSFET 100 of the first embodiment, the high-concentration p type fourth SiC region (channel buffer region) 22 is formed on the channel region side of the second SiC region (source region) 18. Therefore, for example, the leakage current is suppressed during the turn-off at a high temperature even if a channel length Lch (see FIG. 1) of the MOSFET 100 becomes 1.0 µm or less. Accordingly, the stable breakdown voltage can be realized at the low on resistance and high temperature.

In the MOSFET 100 of the first embodiment, desirably the first SiC region (p well region) 16 has the impurity concentration of $5 \times 10^{15}$ cm$^{-3}$ or more and $1 \times 10^{17}$ cm$^{-3}$ or less, and the fourth SiC region (channel buffer region) 22 has the impurity concentration of $1 \times 10^{18}$ cm$^{-3}$ or more and $1 \times 10^{19}$ cm$^{-3}$ or less.

A proper threshold voltage of the MOSFET is difficult to set when the impurity concentration of the first SiC region (p well region) 16 falls outside the above-described range, which is not desirable. The impurity concentration means a concentration that is compensated by N or P.

Possibly the sufficient breakdown voltage cannot be realized when the impurity concentration of the fourth SiC region (channel buffer region) 22 is lower than the above-described range, which is not desirable. The on resistance may be excessively increased when the impurity concentration of the fourth SiC region 22 is more than the above-described range, which is not desirable.

From the viewpoint of achieving the low on resistance and the high breakdown voltage at high temperature, desirably the impurity concentration of the fourth SiC region (channel buffer region) 22 is at least two orders of magnitude higher than that of the first SiC region (p well region) 16.

For example, the impurity concentrations of the first SiC region 16 and fourth SiC region 22 can be evaluated by SIMS analysis. The impurity concentration of the first SiC region (p well region) 16 is represented by the impurity concentration in a central portion of the channel region below the gate insulator 28. The impurity concentration of the fourth SiC region 22 is represented by the maximum impurity concentration between the first SiC region 16 and the second SiC region (source region) 18.

Desirably a length (Lcb in FIG. 1) of the fourth SiC region (channel buffer region) 22 ranges from 0.1×Lch or more to 0.2×Lch or less, where the channel length Lch (see FIG. 1) is a distance from a boundary between the first SiC layer (n− layer) 14 and the first SiC region (p well region) 16 immediately below the gate insulator 28 to a boundary between the second SiC region (source region) 18 and the fourth SiC region (channel buffer region) 22.

Possibly the sufficient breakdown voltage cannot be realized when the length Lcb of the channel buffer region 22 is lower than the above-described range, which is not desirable. The on resistance may be excessively increased when the length Lcb is more than the above-described range, which is also not desirable.

For example, the channel length Lch and the length Lcb of the channel buffer region 22 are determined by an impurity concentration distribution obtained by the SIMS analysis. The length Lcb of the channel buffer region 22 is set to a length of a region whose impurity concentration is one order of magnitude higher than that of the first SiC region (p well region) 16.

In the first embodiment, desirably the channel length Lch is lower than 0.5 μm. This is because the on resistance is expected to be remarkably reduced in the region.

Figure 2:
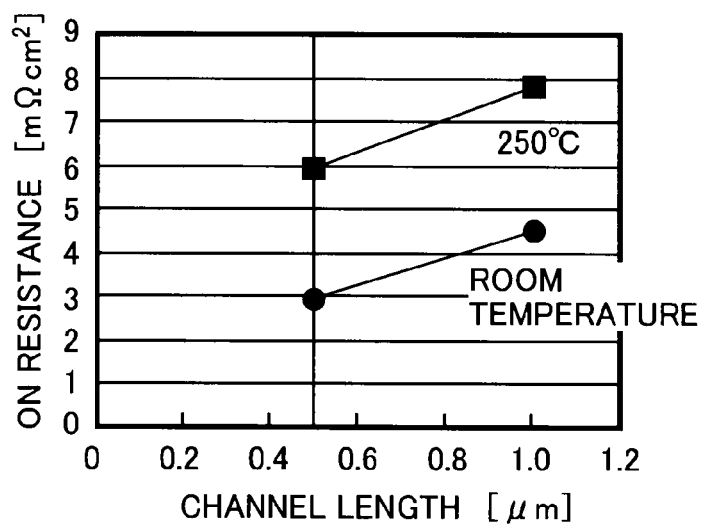
FIG. 2 illustrates a problem of a conventional technology.
Figure 3:
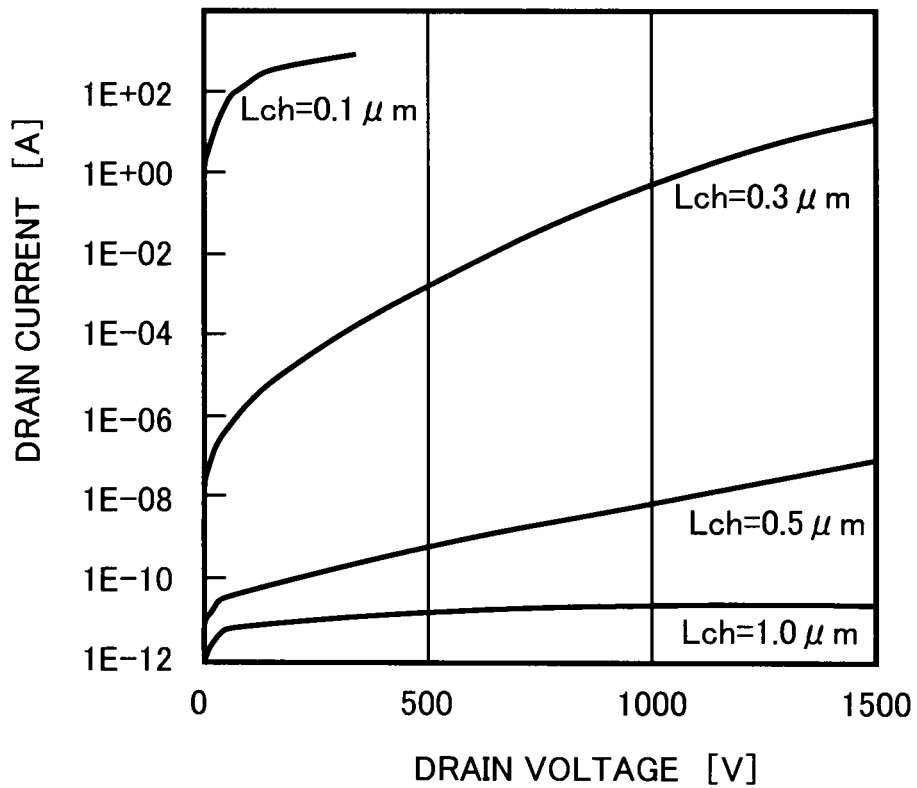
FIG. 3 illustrates a problem of a conventional technology.

FIGS. 2 and 3 illustrate a problem of a conventional technology. FIGS. 2 and 3 illustrate simulation results. In performing the simulation, parameters are set as follows.

Thickness of gate insulator: 50 nm
Concentration of n⁻ layer: $1 \times 10^{16}$ atoms/cm³
Thickness of n⁻ layer: 10 μm
Depth of p well: 0.6 μm
Channel length: 0.1 to 1.0 μm
Source voltage: 0 V
Drain voltage: 0 to 1500 V
Gate voltage: 0 V (turn-off), 15V (turn-on)

FIG. 2 illustrates a relationship between the channel length and the on resistance in the conventional technology in which the channel buffer region does not exist. When the channel length becomes lower than 0.5 μm, the leakage current is increased during the turn-off, and the turn-off operation cannot be performed, whereby the MOSFET is not operated.

FIG. 3 illustrates a relationship between the drain voltage and the drain current in the conventional technology in which the channel buffer region does not exist. It is found that, when the channel length becomes 0.3 μm or less, the leakage current is extremely increased during the turn-off.

Figure 4:
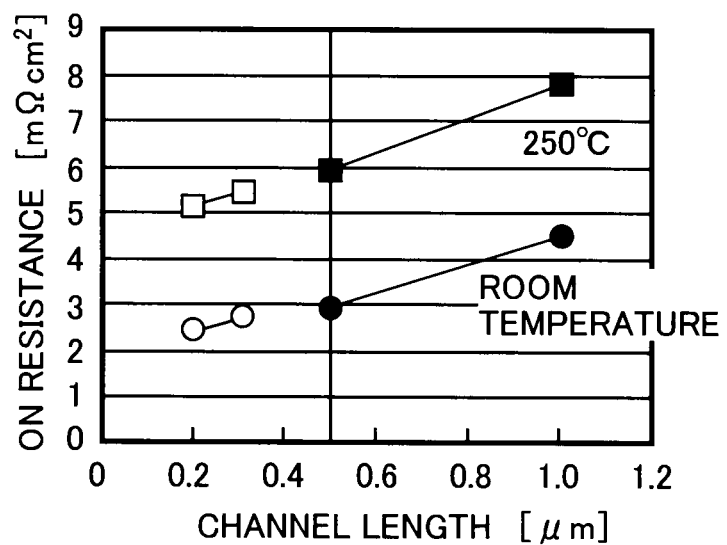
FIG. 4 is a view illustrating a relationship between a channel length and an on resistance of the MOSFET that is the semiconductor device of the first embodiment.

FIG. 4 is a view illustrating a relationship between the channel length and the on resistance of the MOSFET of the first embodiment. A white mark indicates the first embodiment and a black mark indicates the conventional technology in which the channel buffer region does not exist, for the purpose of comparison. A circular mark indicates room temperature and a square mark indicates a temperature of 250° C.

The parameters used in the simulation are set as described above, the impurity concentration of the channel buffer region is set to $5 \times 10^{18}$ cm⁻³, and the length Lcb of the channel buffer region is set to 0.03 μm.

As can be seen from FIG. 4, the MOSFET of the first embodiment is operated up to the channel length of 0.2 μm by providing the channel buffer region, thereby realizing the low on resistance.

Figure 5:
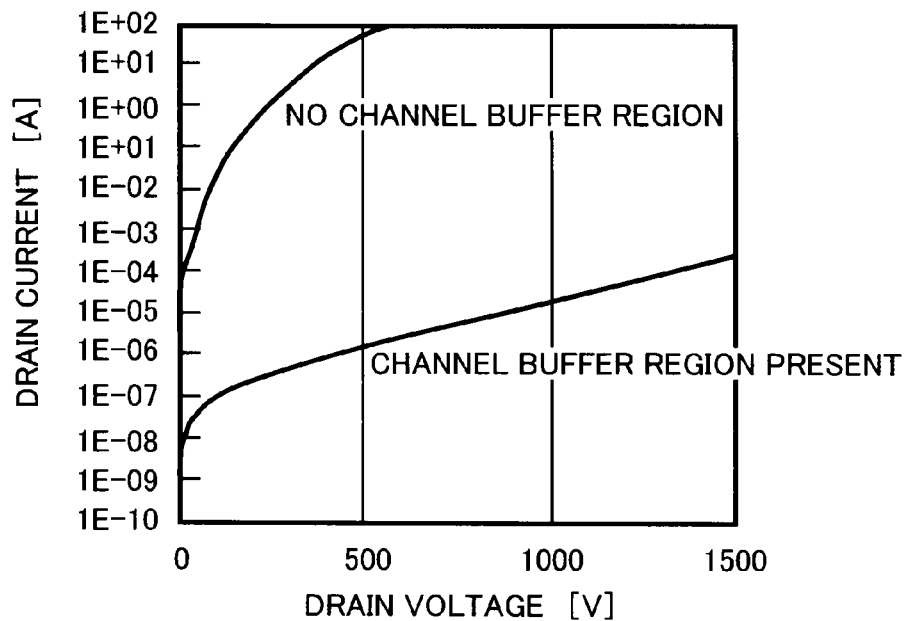
FIG. 5 is a view illustrating a relationship between a drain voltage and a drain current of the MOSFET that is the semiconductor device of the first embodiment.

FIG. 5 is a view illustrating a relationship between the drain voltage and the drain current of the MOSFET of the first embodiment. The parameters of the simulation are similar to those of FIG. 4. FIG. 5 also illustrates the conventional technology, in which the channel buffer region does not exist, for the purpose of comparison. The channel length Lch is set to 0.2 μm. The leakage current is reduced during the turn-off by providing the channel buffer region.

Figure 6:
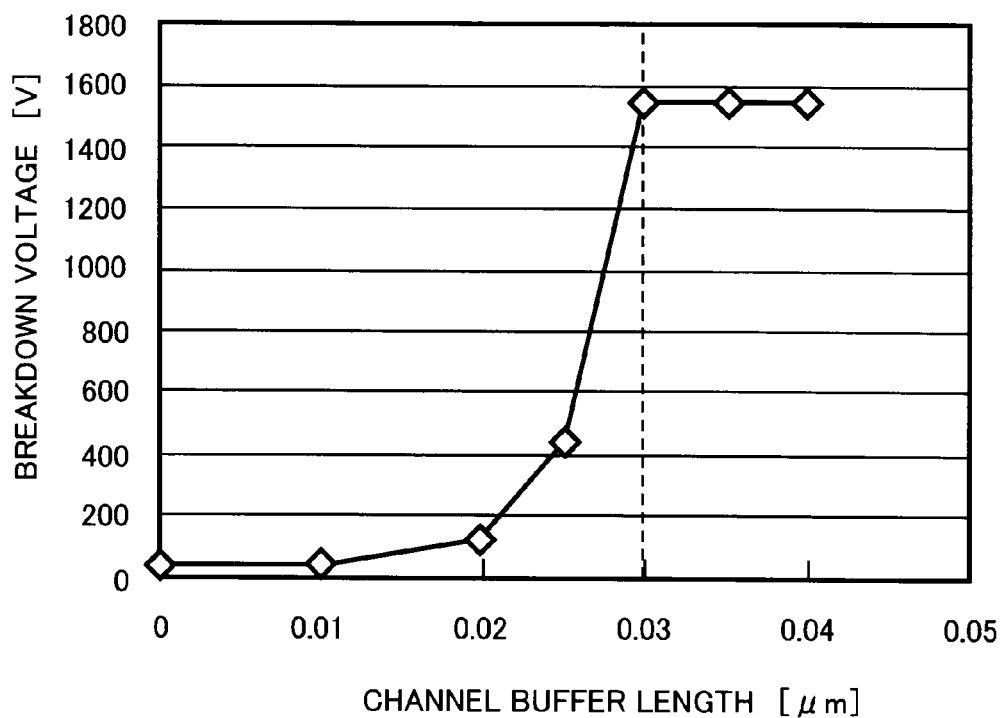
FIG. 6 is a view illustrating a relationship between the channel buffer length and the breakdown voltage of the MOSFET of the first embodiment.

FIG. 6 is a view illustrating a relationship between the channel buffer length Lcb and the breakdown voltage of the MOSFET of the first embodiment. The parameters of the simulation are similar to those of FIGS. 4 and 5 except that the channel buffer length is changed. The channel length Lch is set to 0.2 μm. A voltage exceeding a predetermined threshold current is evaluated as the breakdown voltage.

The breakdown voltage is improved from the channel buffer length of 0.02 μm corresponding to 0.1×Lch, and the constant breakdown voltage of 1500 V or more is secured from the channel buffer length of 0.03 μm corresponding to 0.15×Lch. It is found that the breakdown voltage is determined by avalanche breakdown because the breakdown voltage is kept constant in the region where the channel length is 0.03 μm or more.

Figure 7:
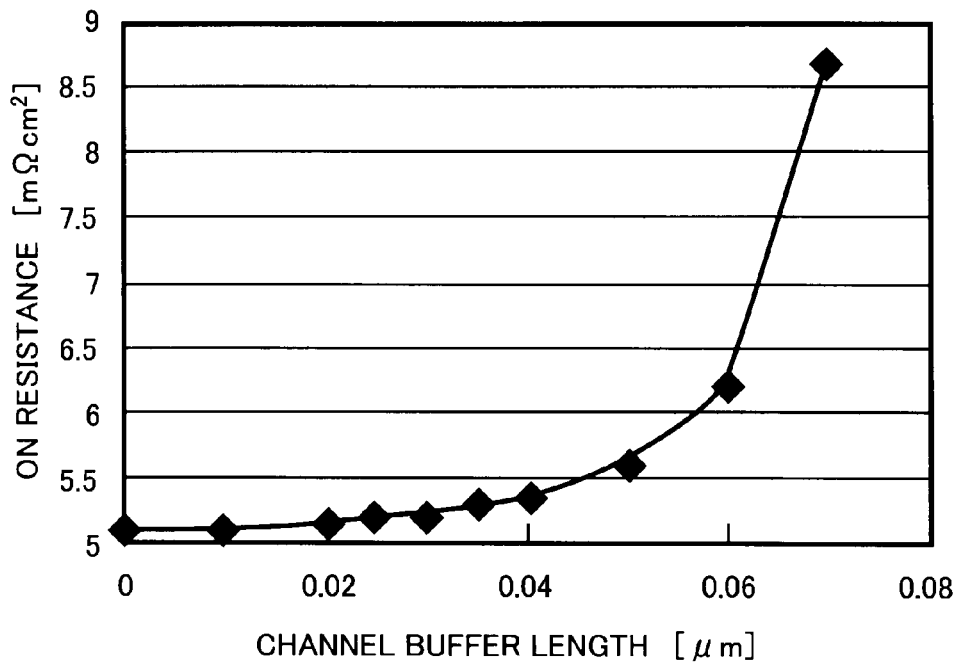
FIG. 7 is a view illustrating a relationship between the channel buffer length and the on resistance of the MOSFET of the first embodiment.

FIG. 7 is a view illustrating a relationship between the channel buffer length Lcb and the on resistance of the MOSFET of the first embodiment. The parameters of the simulation are similar to those of FIG. 6.

As can be seen from FIG. 7, the low on resistance is realized when the channel buffer length is equal to or lower than 0.04 μm corresponding to 0.2×Lch.

Thus, the effect of the first embodiment is confirmed by the simulation.

A method for fabricating the semiconductor device of the first embodiment will be described below. FIGS. 8 to 12 are process sectional views illustrating the method for producing the semiconductor device of the first embodiment.

The hexagonal, low-resistance SiC substrate 12 having the thickness of 300 μm is prepared. The SiC substrate 12 contains P (phosphorous) or N (nitrogen) as the n type impurity with the impurity concentration of about $1 \times 10^{19}$ cm⁻³. The high-resistance SiC layer 14 having the thickness of about 10 μm is epitaxially formed on one of the principal surfaces of the SiC substrate 12. For example, the SiC layer 14 contains N as the n type impurity with the impurity concentration of about $1 \times 10^{16}$ cm⁻³.

Figure 8:
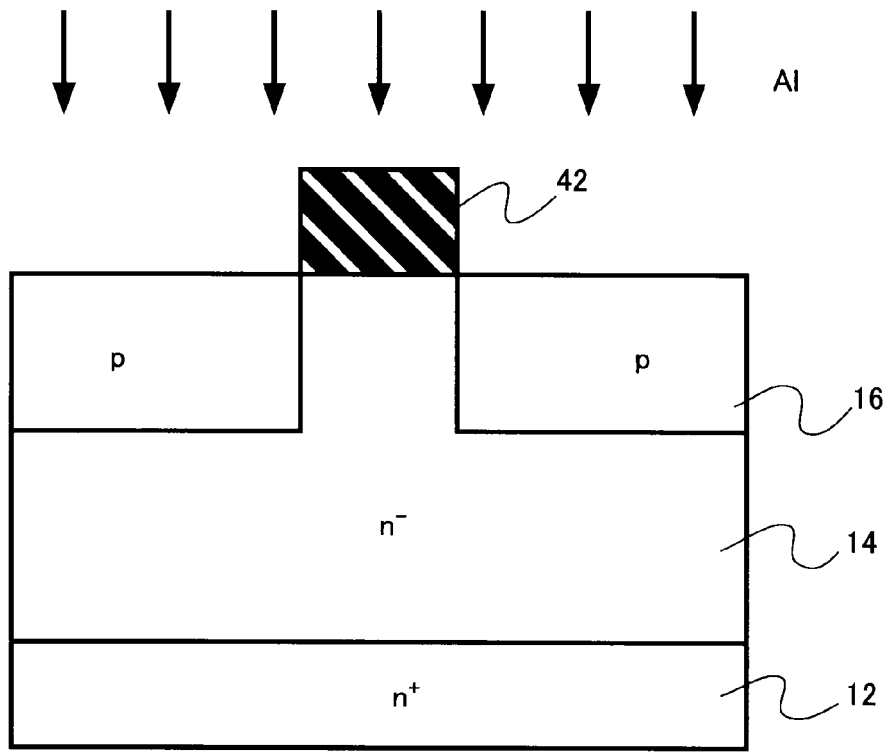
FIG. 8 is a process sectional view illustrating the method for producing the semiconductor device of the first embodiment.

Then a first mask member 42 made of $SiO_2$ is formed by patterning in which photolithography and etching are used. Using the first mask member 42 as an ion implantation mask, Al that is the p type impurity is ion-implanted into the SiC layer 14 to form the p well region 16 (FIG. 8). At this point, N that is the n type impurity may additionally be ion-implanted in order to adjust the final concentration of the p well region 16.

Figure 9:
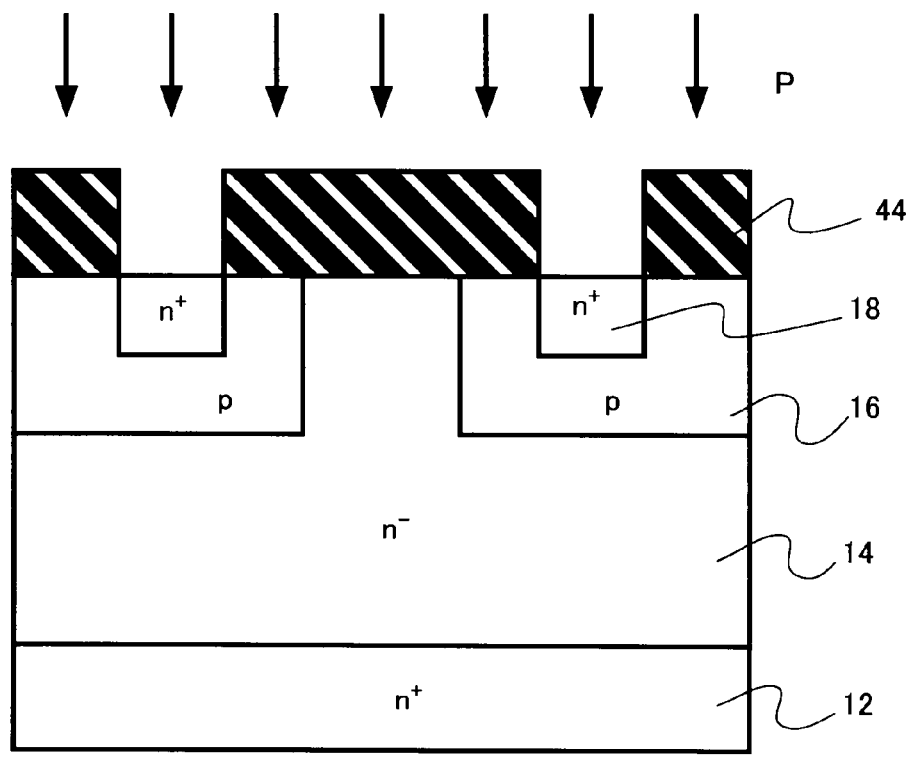
FIG. 9 is a process sectional view illustrating the method for producing the semiconductor device of the first embodiment.

Then a second mask member 44 made of $SiO_2$ is formed by the patterning in which the photolithography and the etching are used. Using the second mask member 44 as the ion implantation mask, P that is the n type impurity is ion-implanted into the SiC layer 14 to form the source region 18 (FIG. 9).

Figure 10:
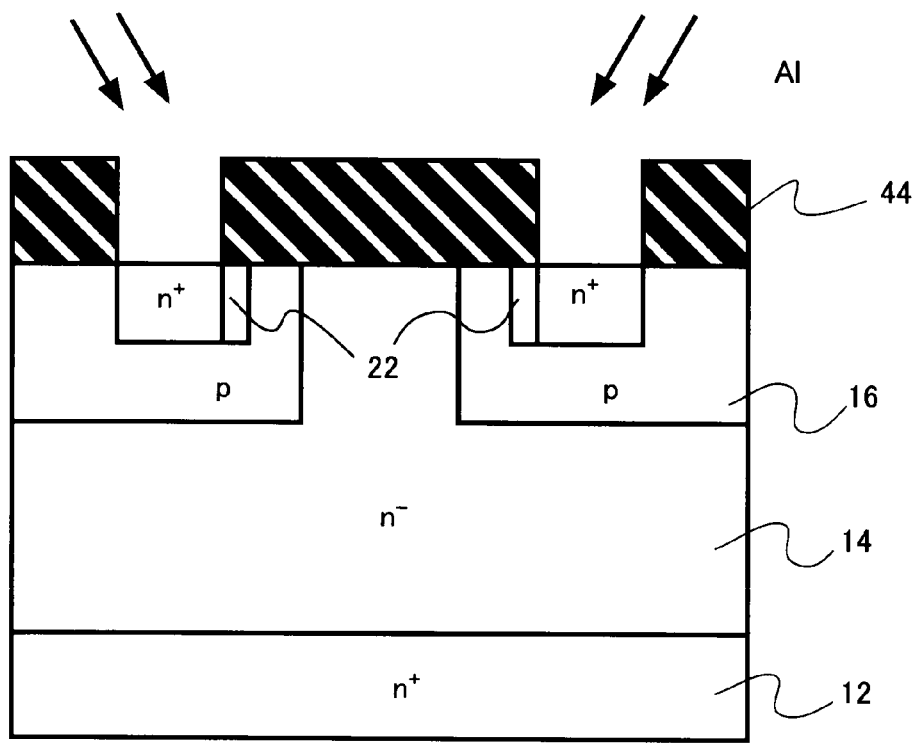
FIG. 10 is a process sectional view illustrating the method for producing the semiconductor device of the first embodiment.

Then, using the second mask member 44 as the ion implantation mask, Al that is the p type impurity is obliquely ion-implanted to form the channel buffer region 22 on the side of the p well region (channel region) 16 of the source region 18 (FIG. 10).

Figure 11:
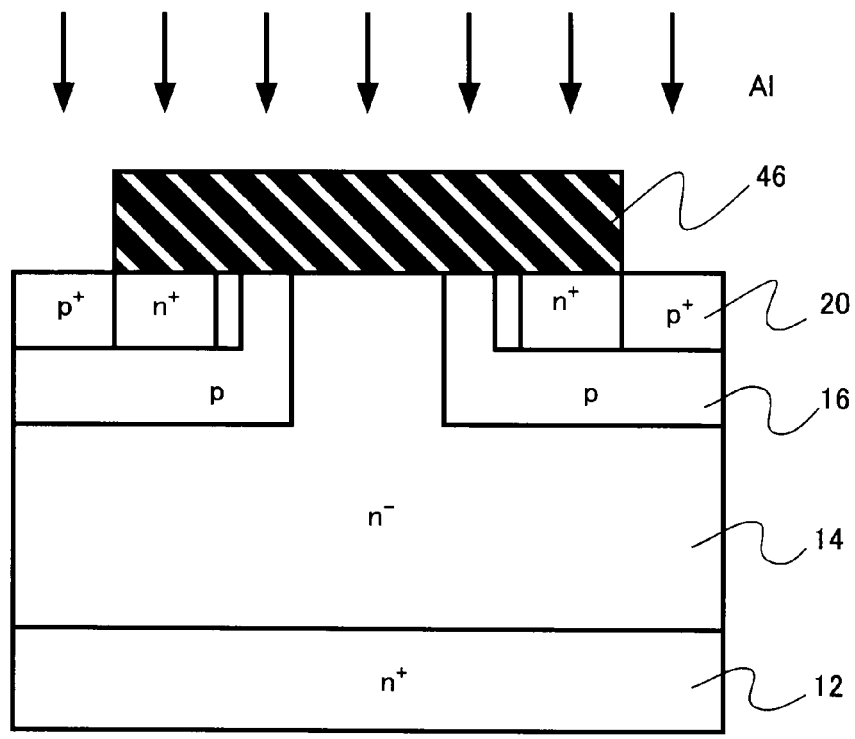
FIG. 11 is a process sectional view illustrating the method for producing the semiconductor device of the first embodiment.

Then a third mask member 46 made of $SiO_2$ is formed by the patterning in which the photolithography and the etching are used. Using the third mask member 46 as the ion implantation mask, Al that is the p type impurity is ion-implanted into the SiC layer 14 to form the p well contact region 20 (FIG. 11).

Figure 12:
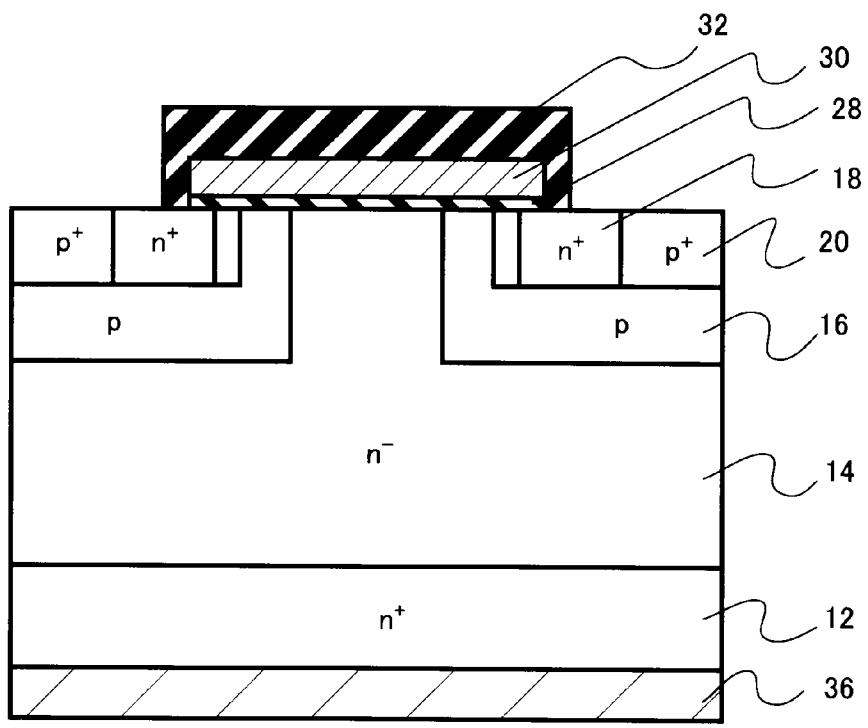
FIG. 12 is a process sectional view illustrating the method for producing the semiconductor device of the first embodiment.

Then the gate insulator 28, the gate electrode 30, and the inter-layer insulator 32 are formed by a well-known semiconductor process (FIG. 12). Then, the first electrode (source/p well common electrode) 24 and the second electrode (drain electrode) 36 are formed, thereby producing the MOSFET illustrated in FIG. 1.

Second Embodiment

While the SiC substrate of the first embodiment is of the n type, a SiC substrate of a semiconductor device according to a second embodiment is of the p type, and constitutes an IGBT (Insulated Gate Bipolar Transistor). The semiconductor device of the second embodiment differs from the semiconductor device of the first embodiment only in the impurity type of the SiC substrate, and thus the overlapped explanation is omitted.

Figure 13:
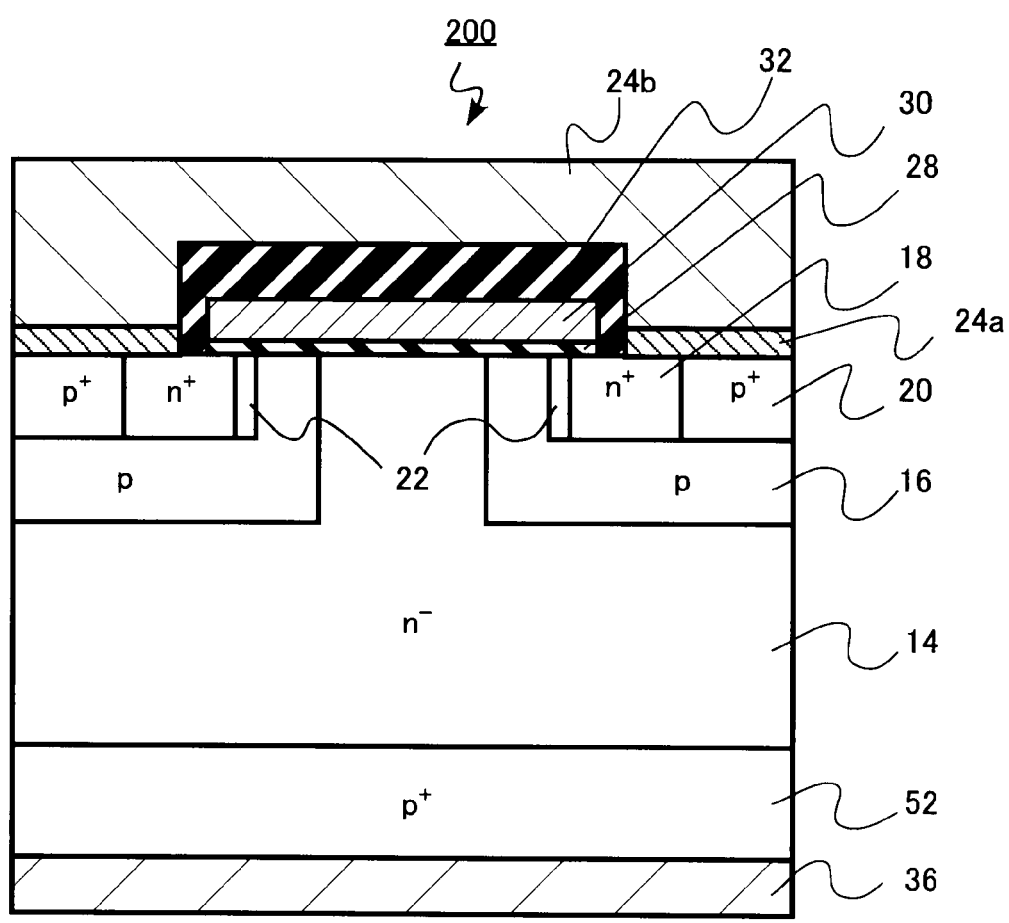
FIG. 13 is a sectional view illustrating a configuration of an IGBT that is a semiconductor device according to a second embodiment.

FIG. 13 is a sectional view illustrating a configuration of the IGBT that is a semiconductor device of the second embodiment. An IGBT 200 includes a SiC substrate (silicon carbide substrate) 52 including first and second principal surfaces. In FIG. 13, the first principal surface is a surface located on an upper side of FIG. 13, and the second principal surface is a surface located on a lower side of FIG. 13. The SiC substrate 52 is a hexagonal SiC substrate (p$^+$ substrate) that contains, for example, Al as the p type impurity with the impurity concentration of about $5\times10^{18}$ to about $1\times10^{19}$ cm$^{-3}$.

In the IGBT 200 of the second embodiment, the high-concentration p type fourth SiC region 22 is formed on the channel region side of the second SiC region (source region) 18. Therefore, for example, the leakage current is suppressed during the turn-off at high temperature even if the channel length Lch of the IGBT 200 becomes 1.0 μm or less. Accordingly, the stable breakdown voltage can be realized at the low on resistance and high temperature.

The method for producing the semiconductor device of the second embodiment differs from that of the first embodiment only in the hexagonal SiC substrate (p+ substrate) that contains Al as the p type impurity.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, the n type MOSFET and n type IGBT in which the electron is used as the carrier have been described in the embodiments. However, the invention can be applied to a p type MOSFET and a p type IGBT, in which a hole is used as the carrier.

What is claimed is:

1. A semiconductor device comprising:
   a silicon carbide substrate having first and second principal surfaces;
   a first-conductive-type silicon carbide layer provided on the first principal surface of the silicon carbide substrate;
   a second-conductive-type first silicon carbide region formed at a surface of the silicon carbide layer;
   a first-conductive-type second silicon carbide region formed at the surface of the first silicon carbide region;
   a second-conductive-type fourth silicon carbide region formed between the first silicon carbide region and the second silicon carbide region, the fourth silicon carbide region having an impurity concentration higher than that of the first silicon carbide region;
   a gate insulator continuously formed on surfaces of the silicon carbide layer, the first silicon carbide region, and the fourth silicon carbide region, the gate insulator being in direct contact with both of the first silicon carbide region and the fourth silicon carbide region;
   a gate electrode formed on the gate insulator;
   an inter-layer insulator with which the gate electrode is covered;
   a first electrode electrically connected to the second silicon carbide region and the third silicon carbide region; and
   a second electrode formed on the second principal surface of the silicon carbide substrate.

2. The device according to claim 1, wherein the first silicon carbide region has the impurity concentration of $5\times10^{15}$ cm$^{-3}$ or more and $1\times10^{17}$ cm$^{-3}$ or less, and the fourth silicon carbide region has the impurity concentration of $1\times10^{18}$ cm$^{-3}$ or more and $1\times10^{19}$ cm$^{-3}$ or less.

3. The device according to claim 1, wherein a channel length Lch is lower than 0.5 μm.

4. The device according to claim 1, wherein the silicon carbide substrate is of the first conductive type and the device is a MOSFET.

5. The device according to claim 1, wherein the silicon carbide substrate is of the second conductive type and the device is an IGBT.

6. The device according to claim 1, wherein the first conductive type is an n type, and the second conductive type is a p type.

7. The device according to claim 1, wherein the second silicon carbide region is shallower than the first silicon carbide region.

8. The device according to claim 1, wherein the gate insulator is a silicon oxide film.

9. The device according to claim 1, wherein the gate electrode is made of polysilicon.

10. The device according to claim 1, wherein the first electrode contains nickel (Ni).

11. The device according to claim 1, wherein the impurity concentration of the fourth silicon carbide region is at least two orders of magnitude higher than that of the first silicon carbide region.

12. A semiconductor device comprising:
    a silicon carbide substrate having first and second principal surfaces;
    a first-conductive-type silicon carbide layer provided on the first principal surface of the silicon carbide substrate;
    a second-conductive-type first silicon carbide region formed at a surface of the silicon carbide layer;
    a first-conductive-type second silicon carbide region formed at the surface of the first silicon carbide region;
    a second-conductive-type fourth silicon carbide region formed between the first silicon carbide region and the second silicon carbide region, the fourth silicon carbide region having an impurity concentration higher than that of the first silicon carbide region;
    a gate insulator continuously formed on surfaces of the silicon carbide layer, the first silicon carbide region, and the fourth silicon carbide region;
    a gate electrode formed on the gate insulator;
    an inter-layer insulator with which the gate electrode is covered;
    a first electrode electrically connected to the second silicon carbide region and the third silicon carbide region; and
    a second electrode formed on the second principal surface of the silicon carbide substrate,
    wherein a length of the fourth silicon carbide region ranges from 0.1×Lch or more to 0.2×Lch or less, where a channel length Lch is a distance from a boundary between the silicon carbide layer and the first silicon carbide region immediately below the gate insulator to a boundary between the second silicon carbide region and the fourth silicon carbide region.

13. The device according to claim 12, wherein the first silicon carbide region has the impurity concentration of $5\times10^{15}$ cm$^{-3}$ or more and $1\times10^{17}$ cm$^{-3}$ or less, and the fourth silicon carbide region has the impurity concentration of $1\times10^{18}$ cm$^{-3}$ or more and $1\times10^{19}$ cm$^{-3}$ or less.

14. The device according to claim 12, wherein a channel length Lch is lower than 0.5 μm.

15. The device according to claim 12, wherein the silicon carbide substrate is of the first conductive type and the device is a MOSFET.

16. The device according to claim 12, wherein the silicon carbide substrate is of the second conductive type and the device is an IGBT.

17. The device according to claim 12, wherein the first conductive type is an n type, and the second conductive type is a p type.

18. The device according to claim 12, wherein the second silicon carbide region is shallower than the first silicon carbide region.

19. The device according to claim 12, wherein the gate insulator is a silicon oxide film.

20. The device according to claim 12, wherein the gate electrode is made of polysilicon.

\* \* \* \* \*